United States Patent
Koops et al.

(10) Patent No.: US 6,903,549 B2
(45) Date of Patent: Jun. 7, 2005

(54) ELECTRON SPECTROMETER

(75) Inventors: Hans W. P. Koops, Ober-Ramstadt (DE); Alexander Kaya, Rossdorf (DE)

(73) Assignee: NaWoTec GmbH, Rossdorf (DE)

( * ) Notice: Subject to any disclaimer, the term of this patent is extended or adjusted under 35 U.S.C. 154(b) by 167 days.

(21) Appl. No.: 10/362,181
(22) PCT Filed: Aug. 8, 2001
(86) PCT No.: PCT/EP01/09158
§ 371 (c)(1),
(2), (4) Date: Jun. 27, 2003
(87) PCT Pub. No.: WO02/19383
PCT Pub. Date: Mar. 7, 2002

(65) Prior Publication Data
US 2004/0204640 A1 Oct. 14, 2004

(30) Foreign Application Priority Data
Aug. 31, 2000 (DE) .................................. 100 42 663

(51) Int. Cl.$^7$ .................................. G01V 3/00
(52) U.S. Cl. ..................... 324/307; 324/309
(58) Field of Search ................. 324/307, 309, 324/300, 318, 319, 322, 315, 316

(56) References Cited

U.S. PATENT DOCUMENTS

| | | | | |
|---|---|---|---|---|
| 3,435,207 A | * | 3/1969 | Baldwin | 250/287 |
| 3,670,172 A | * | 6/1972 | Golden | 250/305 |
| 6,159,620 A | * | 12/2000 | Heath et al. | 428/615 |

* cited by examiner

Primary Examiner—Brij B. Shrivastav
(74) Attorney, Agent, or Firm—Woodling, Krost and Rust

(57) ABSTRACT

Inordinate localised systems are used at room temperature in a novel device in the form of an electron spectrometer for utilising single-electron electronic applications. Said electron spectrometer device consists of a nanocrystalline metal or a nanocrystalline semiconductor material used as conductor strip connection in the form of an inlet or an outlet for single-electron electronic components and circuits consisting of lithographically produced quantum dots. The resulting single-electron electronic device consisting of quantum dots is supplied with energetically very sharply defined electrons. Said device can thus be operated at room temperature, undisturbed by phonons.

48 Claims, 2 Drawing Sheets

ELECTRON SPECTROMETER

The measurement and production processes available today for single-electron electronics, for single-electron tunneling (SET) devices, and for their applications (such as that of SET transistors) are based on semiconductors (e.g., lateral GaAs/AlGaAs heterostructures) or metallic quantum dots, which are made accessible to electrical measuring devices by means of metallic or semiconducting contacts [T. H. Oosterkamp, L. P. Kouwenhoven, A. E. A. Koolen, N. C. van der Vaart, and C. J. P. M. Harmans, Phys. Rev. Lett. 78, 1536 (1997)]. The conventional production processes of thin-film technology produce quantum dots with dimensions in the 20-nm range; because of the laws of quantum mechanics, however, the energy levels of these dots can be separated only by gaps of a few 100 $\mu$eV. Because of the small gaps between adjacent, discrete energy stages, very low temperatures (<4 K) are required for the observation and use of the effects which can be observed and generated on the Coulomb blockade in these quantum dot systems. At these low temperatures, the phonons of the energy kT existing in the metal lattice are no longer able to excite electrons and thus raise them from one energy level to another.

The task of the invention is to make available a room-temperature measuring method for single-electron electronics.

This task is accomplished by the main claim in conjunction with the subclaims.

A novel arrangement for making available room-temperature applications of single-electron electronics (single-electron tunneling, SET) by taking advantage of localized, 0-dimensional states in disordered nanocrystalline systems for an electron spectrometer is described. The electron spectrometer consists of conductor pathway connections, which are made of a nanocrystalline composite material consisting of nanocrystals of metal or semiconductor material in a nonconductive matrix and which connect the single-electron electronics circuit to metal conductors leading to the outside world. In the nanocrystals of the lead-ins there are localized electron wave packets, which, in accordance with Bohr's conditions for eigenvalue solutions in the central potential, assume spatially and energetically discrete values in the electronic wave modes of the electron gas of the individual nanoparticles and therefore represent highly quantized systems (0-dimensional electron gas). An electron which is present in this system assumes discrete states and persists in its original location until, as a result of external excitation by, for example, an applied voltage or the influence of phonons, it migrates or "hops" to the next free and energetically favorable location ("hopping" conduction). As a function of these discrete energy states and by a suitable choice of them, it is possible to suppress or to promote the conduction of electrons at given temperatures.

The electron spectrometer described here makes use of these principles to make available quantum dot systems and SET applications such as the SET transistor by providing suitable disordered materials upline and downline of the quantum dots to serve as electrical contacts for the quantum dot systems, components, or circuits to be studied. Because electrons "stick" in their places in these materials even at room temperature, the interfering influence of high temperatures on the quantum dot or on the Coulomb blockade is suppressed.

The invention is explained in greater detail on the basis of the figures.

Figure 1:
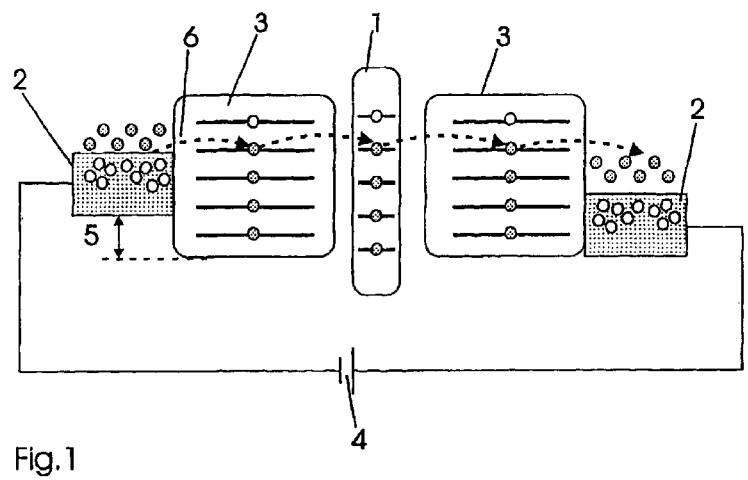
FIG. 1 shows a schematic diagram of the electron spectrometer for single-electron electronics.

The working principle is illustrated in FIG. 1: The quantum dot (1) is separated spatially from the electrical contacts (2) on the left and right and surrounded by the 0-dimensional electron gas material (3). The electrical contacts are connected to a voltage source (4), by means of which the potential of the contact electrons (5) can be varied. The electrons can migrate from the left contact (6) to the discrete states of the 0-dimensional electron gas only after the thermal electrons of the contact material have been raised energetically above the voltage source in such a way that they coincide with a discrete level of the 0-dimensional system. Room-temperature electrons, furthermore, are blocked when the energy levels are separated more widely than $kT_{room}$. The quantum dot (1) is thus surrounded by a "frozen" electron environment. These cold electrons can be transported to the quantum dot only when one of its levels coincides with a level of the 0-dimensional electron gas, which can also be shifted by the voltage source. The transport process proceeds in the same way in the 0-dimensional electron environment on the right until the electrons reach the electrical contact and form a closed circuit with a discrete current/voltage characteristic.

The method described was realized experimentally by corpuscular radiation-induced deposition and was confirmed by electrical measurements at room temperatures. This novel method of materials production is characterized by the use of organometal compounds and by corpuscular beams of the highest possible power density and the highest possible local confinement. The layers of the organometal compound which have been adsorbed on the surface of the substrate are converted into nanocrystalline substances by bombardment with corpuscular beams. These composite nanocrystalline materials consist of segregated noble metal monocrystals, which are embedded in a nonconductive matrix. Thus these materials form disordered systems, in which localized energy states play the key role in all transport processes (hopping). The electrical conductivity is described by:

$$\sigma \propto e^{-(T_0/T)^x}$$

where $T_0$ and x are constants and x0.5 for three-dimensional composites (cermets). The law was experimentally confirmed on the basis of materials produced by corpuscular radiation-inducted deposition from organometallic starting materials. For gold and platinum-containing materials, an exponent of x0.5 was found over a wide temperature range. Because the hopping activation energies or gaps of available adjacent discrete energy states are between 30 meV and 150 meV, depending on the temperature, these materials are especially suitable as 0-dimensional environments for room-temperature quantum dot systems.

The method was experimentally confirmed by the process of corpuscular radiation-induced deposition, a novel method of materials production which is characterized by the use of organometal compounds, and shows Coulomb oscillations with voltage deflections of up to 50 mV in quantum dot systems at room temperature.

Figure 2:
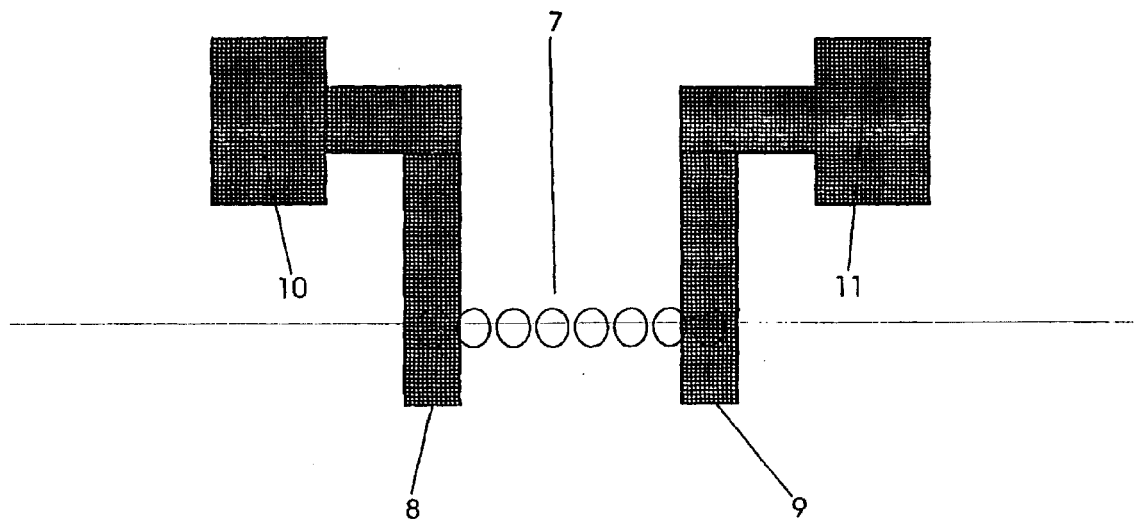
FIG. 2 shows a diagram of an embodiment of an electron spectrometer which can be produced by computer-controlled, corpuscular radiation-induced deposition from a gold-containing starting material into a prepared metal connecting structure.

FIG. 2 shows a schematic diagram of a quantum dot system (7), consisting of several quantum dots with diameters of approximately 30 nm, connected in series, which were produced by means of corpuscular radiation-induced deposition from, for example, a gold-containing organometal starting substance. The quantum dots themselves are built up in turn out of nanocrystalline material with crystallites in the nm range, which quantize the electron gas of the crystallites. The two lead-ins, i.e., that on the left (8) and that right (9), were produced by the same deposition method and consist of nanocrystallites in a nonconductive matrix. They serve as 0-dimensional electron gas energy filters for supplying the structure with energy-selected electrons. With their 3-dimensional electron gas, the electrical contacts (10) and (11) replenish the supply of electrons required to feed the circuit and carry the signals to the electronic measuring circuit in the outside world.

The design of the electron spectrometer was experimentally confirmed on the basis of a structure produced by the process of corpuscular radiation-induced deposition. Ultrafine structures ranging in size down to a point diameter of 5 nm with an edge roughness of 2 nm are produced by electron radiation-inducted deposition in the scanning-electron microscope (SEM) or in the scanning-tunneling microscope (STM).

The electron spectrometer arrangement described here was produced under computer control of the deposition process and thus of the material composition and uses the novel nanocrystalline material produced according to the method, which consists of disordered crystal systems, in which localized, 0-dimensional systems are formed by the constructive interference of electron waves in the nanocrystals to form spatially and energetically localized wave packets. Thus the nanocrystals have a zero-dimensional electron gas with wide gaps between the energy levels. Because these discrete energy states in the nanocrystals consisting of crystallites with diameters in the range of 2–4 nm are separated by gaps of up to 150 meV, the smearing-out of, or interference with, the Coulomb blockade itself by the excitation of electrons with phonons, which have an energy of kT=25 meV at room temperature, is suppressed. Because there is no extensive crystal lattice in which phonons can propagate without scattering, there are no phonons in the nanocrystalline material. This further reduces the smearing-out of the energy of the electrons which are carrying the signals.

Figure 3:
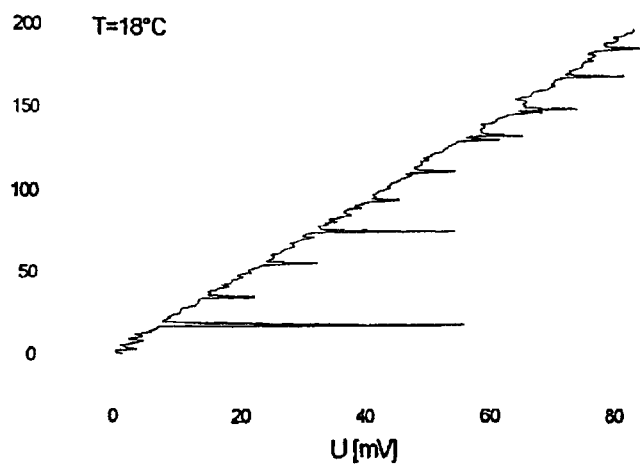
FIG. 3 shows a current-stabilized current/voltage characteristic of an experimentally built electron spectrometer according to FIG. 2 for measuring the Coulomb oscillation in a quantum dot system.

FIG. 3 shows the current/voltage characteristic of the arrangement with a structure realized experimentally according to FIG. 2. The measurement was made during current-stabilized operation at room temperature (20° C.). During the measurement at room temperature, characteristic discrete voltage variations of up to 50 mV are observed, similar to those observed for double quantum dots at low temperatures.

Figure 4:
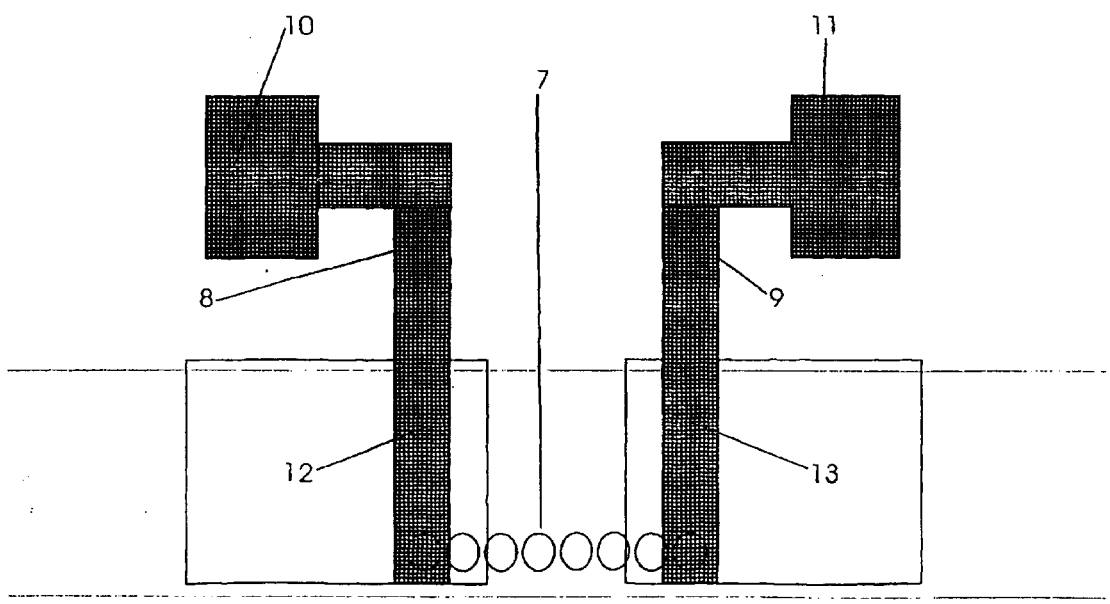
FIG. 4 shows a diagram of an embodiment of an electron spectrometer with energy and spin-selection regions for preadjustment and for the analysis of the activity of the component.

The electron spectrometer can be used advantageously as an active measuring device for the study of single-electron components and circuits, when the nanocrystalline lead-ins to and lead-outs from the single-electron components and circuits to be studied are designed as specially manufactured quantum dots with widely spaced energy levels, by means of which it is possible, through the use of physical effects such as compression, tension, local temperature, spectral illumination, electric field strength and magnetic field strength, externally to influence and to adjust the energy and the spin of the electrons used in the study, selectively to define and to adjust the spin of the transferred, spectroscopically selected electrons, and to supply them to the study object. It is also advantageous to provide similarly constructed, specially prepared quantum dots with widely separated energy levels downline from the study object, by means of which it is possible, through the use of physical effects such as compression, tension, local temperature, spectral illumination, electric field strength and magnetic field strength, externally to influence and effectively to adjust the energy and states of the quantum dots, to select the spin of the transferred, spectroscopically selected electrons, to analyze them, and thus to acquire information concerning the activity of the study object by measurement and analysis. FIG. 4 shows a diagram of an embodiment of the electron spectrometer with energy and spin selection regions (12, 13) for presetting the component (7) and for analyzing its activity.

Disordered localized systems are therefore used in a novel arrangement as an electron spectrometer for making available single-electron electronics applications available for use at room temperature. The arrangement acting as an electron spectrometer consists of a nanocrystalline material of metal or semiconductor material, which serves as conductor pathway connections for supplying electrons to, and for carrying them away from, the single-electron components and circuits, which consist of lithographically fabricated quantum dots. The electron system of the nanocrystalline material is characterized in that only spatially and energetically localized (discrete) electron states with energy gaps of several meV are present in it (0-dimensional electron gas). This also characterizes the energy level system of the quantum dots. Electrons which form a 3-dimensional electron gas in conventional metallic contacts are sent by direct contact into this 0-dimensional electron gas, where they are subjected to spectroscopic filtering in such a way that they can then occupy only the discrete energy states of the 0-dimensional electron gas in the conductor pathway. If the gaps between these discrete energy states are greater than the energy of the phonons at room temperature, that is, >kT=27 meV, the system blocks (filters out) all the electrons coming from the metal of the lead-ins and lead-outs, so that electron transport is possible only as a result of an externally applied voltage by way of the conduction mechanism known as "hopping", in which electrons hop over the discrete energy states of the material with the 0-dimensional electron gas. The downstream single-electron device consisting of quantum dots is therefore supplied with electrons with very sharply defined energies. It can therefore be operated at room temperature without interference from phonons.

What is claimed is:

1. Electron spectrometer for supplying and measuring single-electron components and circuits, characterized in that the single-electron components and circuits to be supplied and measured are first connected to the outside world at the input and output of the components and circuits by conductor pathways, surfaces, or layers; in that the conductor pathways, surfaces, or layers consist of nanocrystalline material with widely separated energy levels, similar to those present in a 0-dimensional electron gas; and in that the electrons with many closely spaced energies offered by the metallic connections to the outside world are selected with respect to their energies by the discrete levels present in the 0-dimensional electron gas system, are filtered as if spectroscopically according to their energies, and are then sent to the single-electron device to be studied.

2. Electron spectrometer for supplying and measuring single-electron components and circuits according to claim 1, characterized in that the connecting conductor pathways consist of material with the energy level distribution of a 0-dimensional electron gas material; and in that the energy gaps in meV between the levels are at least as wide as the energy of the phonons at the temperature selected for the measurement.

3. Electron spectrometer for supplying and measuring single-electron components and circuits according to claim 1, characterized in that the connecting conductor pathways consist of material with the energy level distribution of a 0-dimensional electron gas material; and in that the energy gaps between the levels are equal to at least 27 meV, which corresponds to the energy of phonons at room temperature, in order to suppress the effects of thermal interference with the Coulomb blockade in the single-electron components and circuits at room temperature.

4. Electron spectrometer for supplying and measuring single-electron components and circuits according to claim 2 characterized in that the connecting conductor pathways consist of material with the energy level distribution of a 0-dimensional electron gas material; and in that the energy gaps between the levels are equal to at least 27 meV, which corresponds to the energy of phonons at room temperature, in order to suppress the effects of thermal interference with the Coulomb blockade in the single-electron components and circuits at room temperature.

5. Electron spectrometer for supplying and measuring single-electron components and circuits at room temperature according to claim 1, characterized in that the transport of the electrons along the connecting conductor pathways from the 0-dimensional electron gas material after the application of a voltage to the contacts with the outside world takes place by the hopping or tunneling of the electrons between the nanocrystals and the single-electron components and circuits; and in that no ohmic losses occur during this process.

6. Electron spectrometer for supplying and measuring single-electron components and circuits at room temperature according to claim 2, characterized in that the transport of the electrons alone the connecting conductor pathways from the 0-dimensional electron gas material after the application of a voltage to the contacts with the outside world takes place by the hopping or tunneling of the electrons between the nanocrystals and the single-electron components and circuits; and in that no ohmic losses occur during this process.

7. Electron spectrometer for supplying and measuring single-electron components and circuits at room temperature according to claim 3, characterized in that the transport of the electrons along the connecting conductor pathways from the 0-dimensional electron gas material after the application of a voltage to the contacts with the outside world takes place by the hopping or tunneling of the electrons between the nanocrystals and the single-electron components and circuits; and in that no ohmic losses occur during this process.

8. Electron spectrometer for supplying and measuring single-electron components and circuits at room temperature according to claim 4, characterized in that the transport of the electrons along the connecting conductor pathways from the 0-dimensional electron gas material after the application of a voltage to the contacts with the outside world takes place by the hopping or tunneling of the electrons between the nanocrystals and the single-electron components and circuits; and in that no ohmic losses occur during this process.

9. Electron spectrometer for supplying and measuring single-electron components and circuits at room temperature according to claim 1, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

10. Electron spectrometer for supplying and measuring single-electron components and circuits at room temperature according to claim 2, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

11. Electron spectrometer for supplying and measuring single-electron components and circuits at room temperature according to claim 3, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

12. Electron spectrometer for supplying and measuring single-electron components and circuits at room temperature according to claim 4, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

13. Electron spectrometer for supplying and measuring single-electron components and circuits at room temperature according to claim 5, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

14. Electron spectrometer for supplying and measuring single-electron components and circuits at room temperature according to claim 6, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

15. Electron spectrometer for supplying and measuring single-electron components and circuits at room temperature according to claim 7, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

16. Electron spectrometer for supplying and measuring single-electron components and circuits at room temperature according to claim 8, characterized in that specially fabricated quantum dots with widely separated energy levels are provided upline and downline from the single-electron components and circuits to be studied; and in that the quantum dots can be externally influenced and effectively adjusted with respect to the gaps between their energy levels by the use of physical effects such as compression, tension, local temperature, spectral illumination, electrical field strength, and magnetic field strength, so that the electron energy can be coordinated with and adapted to the single-electron objects to be studied.

17. Electron spectrometer for supplying and measuring single-electron components and circuits at room temperature according to claim 1, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

18. Electron spectrometer for supplying and measuring single-electron components and circuits at room temperature according to claim 2, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

19. Electron spectrometer for supplying and measuring single-electron components and circuits at room temperature according to claim 3, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

20. Electron spectrometer for supplying and measuring single-electron components and circuits at room temperature according to claim 4, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

21. Electron spectrometer for supplying and measuring single-electron components and circuits at room temperature according to claim 5, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

22. Electron spectrometer for supplying and measuring single-electron components and circuits at room temperature according to claim 6, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

23. Electron spectrometer for supplying and measuring single-electron components and circuits at room temperature according to claim 7, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

24. Electron spectrometer for supplying and measuring single-electron components and circuits at room temperature according to claim 8, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

25. Electron spectrometer for supplying and measuring single-electron components and circuits at room temperature according to claim 9, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

26. Electron spectrometer for supplying and measuring single-electron components and circuits at room temperature according to claim 10, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

27. Electron spectrometer for supplying and measuring single-electron components and circuits at room temperature according to claim 11, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

28. Electron spectrometer for supplying and measuring single-electron components and circuits at room temperature according to claim 12, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

29. Electron spectrometer for supplying and measuring single-electron components and circuits at room temperature according to claim 13, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

30. Electron spectrometer for supplying and measuring single-electron components and circuits at room temperature according to claim 14, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

31. Electron spectrometer for supplying and measuring single-electron components and circuits at room temperature according to claim 15, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

32. Electron spectrometer for supplying and measuring single-electron components and circuits at room temperature according to claim 16, characterized in that the specially fabricated quantum dots with widely spaced energy levels are provided upline and downline from the single-electron components and circuits to be studied in that the quantum dots are externally influenced and effectively adjusted by the use of physical effects such gas compression, tension, local temperature, spectral illumination, electrical field strength, and magnetic field strength; and in that as a result, the transferred, spectroscopically selected electrons are selectively designed and adjusted with respect to their electron spin and supplied to the study object.

33. Electron spectrometer for supplying and measuring single-electron components and circuits at room temperature according to claim 17, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

34. Electron spectrometer for supplying and measuring single-electron components and circuits at room temperature according to claim 18, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

35. Electron spectrometer for supplying and measuring single-electron components and circuits at room temperature according to claim 19, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

36. Electron spectrometer for supplying and measuring single-electron components and circuits at room temperature according to claim 20, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

37. Electron spectrometer for supplying and measuring single-electron components and circuits at room temperature according to claim 21, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

38. Electron spectrometer for supplying and measuring single-electron components and circuits at room temperature according to claim 22, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

39. Electron spectrometer for supplying and measuring single-electron components and circuits at room temperature according to claim 23, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

40. Electron spectrometer for supplying and measuring single-electron components and circuits at room temperature according to claim 24, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

41. Electron spectrometer for supplying and measuring single-electron components and circuits at room temperature according to claim 25, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

42. Electron spectrometer for supplying and measuring single-electron components and circuits at room temperature according to claim 26, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

43. Electron spectrometer for supplying and measuring single-electron components and circuits at room temperature according to claim 27, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

44. Electron spectrometer for supplying and measuring single-electron components and circuits at room temperature according to claim 28, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

45. Electron spectrometer for supplying and measuring single-electron components and circuits at room temperature according to claim 29, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

46. Electron spectrometer for supplying and measuring single-electron components and circuits at room temperature according to claim 30, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

47. Electron spectrometer for supplying and measuring single-electron components and circuits at room temperature according to claim 31, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

48. Electron spectrometer for supplying and measuring single-electron components and circuits at room temperature according to claim 32, characterized in that similarly constructed, specially fabricated quantum dots with widely spaced energy levels are provided downline; in that these quantum dots are externally influenced and effectively adjusted by the use of physical effects such gas compression, tension, local temperature, spectral illumination, electric field strength and magnetic field strength; and in that the transferred, spectroscopically selected electrons which have been selected with respect to their electron spin are analyzed, with the result that information concerning the activity of the study object can be obtained by measurement and analysis.

\* \* \* \* \*